Sept. 2, 1969 R. G. DONALD 3,465,214

HIGH-CURRENT INTEGRATED-CIRCUIT POWER TRANSISTOR

Filed March 23, 1967 2 Sheets-Sheet 1

INVENTOR
RAYMOND G. DONALD
BY
Robert Levine
ATTORNEY

Sept. 2, 1969 R. G. DONALD 3,465,214

HIGH-CURRENT INTEGRATED-CIRCUIT POWER TRANSISTOR

Filed March 23, 1967 2 Sheets-Sheet 2

INVENTOR
RAYMOND G. DONALD
BY
Robert Levine
ATTORNEY

United States Patent Office 3,465,214
Patented Sept. 2, 1969

3,465,214
HIGH-CURRENT INTEGRATED-CIRCUIT POWER TRANSISTOR

Raymond G. Donald, Burlington, Mass., assignor to P. R. Mallory & Co. Inc., Indianapolis, Ind., a corporation of Delaware Filed Mar. 23, 1967, Ser. No. 625,535
Int. Cl. H01l *19/00*
U.S. Cl. 317—235 10 Claims

ABSTRACT OF THE DISCLOSURE

A high-current, double-diffused, bipolar power transistor for use in monolithic integrated circuits having comb-shaped emitter and base regions surmounting a collector region and having interdigitated metallized emitter and collector contacts with a serpentine base contact therebetween.

The very features of integrated circuits which produce their many advantages also present some drawbacks in comparison to discrete semiconductor devices. In particular, the integrated-circuit art has been almost entirely confined to the micro- and milli-watt power region by the lack of a suitable power transistor conformable with the requirements of monolithic integrated circuits. The difficulties focus primarily around restrictions on heat dissipation and limitations on the diffusion operatitons caused by the requirements of other circuit components on the same chip.

There are several methods of attacking these difficulties. Perhaps the most obvious method is to enhance heat dissipation by increasing the area of the transistor and the efficiency of heat transfer therefrom. Advantages may also be obtained by choosing an efficient operating mode for the transistor and designing it specifically for this mode; for instance, since a transistor amplifier acts as a variable resistance, a switching (class D) mode will be more efficient than a linear (class A, B or C) mode, and a transistor specifically designed for switching-mode operation will be more efficient than one not so designed. Additionally, the internal structure of the transistor may be optimized to some degree, within the limitations imposed by the requirements of other components on the same chip or wafer, in order to render the transistor more suitable for high-power or high-current operation. Finally, the geometrical configurattion of the power transistor may be altered from that of conventional practice in order to achieve suitability for monolithic integration.

Although all of the above methods are utilized in the integrated power transistor of the present invention, primary attention has been given to devising a geometrical configuration which is particularly advantageous for increasing the power-handling capability of such a transistor Current gain is a function of current density in the base region, the gain reaching a maximum at a certain value of current density. It is especially true of the narrow-base, double-diffused transistors used in integrated circuits that current-crowding renders effective only a narrow region at the edge of the emitter, so that the maximum operating current of the transistor is proportional to the emitter perimeter rather than to the emitter area. It is also true that minimization of the area of the emitter is desirable in terms of economical use of available chip area and in terms of the reduction of junction capacitance for improving high-frequency characteristics. These considerations would indicate the use of a long narrow emitter region. Such an emitter, however, would lead to excessive voltage drops along its length and resulting debiasing of some parts of the emitter; furthermore, the unsymmetrical geometry would lead to undesired current concentrations and the risk of thermal runaway.

These objections are alleviated by the use of an interdigitated structure in which the emitter region consists of a series of fingers extending from a larger-area contact pad and in which the base contact forms a complementary series of fingers and a contact pad interlocking with the emitter region. This method is, however, unsuitable for integrated-circuit transistors, since the collector contact must be brought out to the top surface of the chip and since narrow lateral extension of the base and collector regions is desirable, especially for the reduction of the value of saturation voltage.

The foregoing considerations of integrated-circuit transistor geometry lead, in the present invention, to a transistor structure fabricated on a semiconductor chip and consisting of an epitaxial collector region, a base region diffused into the collector region and having a central portion of substantially linear extent and a series of fingers extending from the central portion in at least one direction, and an emitter region diffused into the base region and having substantially the same shape as the base region, but necessarily of slightly smaller size. Electrical contacts to these regions are provided by a metallized emitter contact covering substantially the area of the emitter region, a metallized collector contact covering substantially the exposed area of the collector region, and a metallized, serpentine base contact interwound between the collector and emitter contacts and in closely and uniformly spaced relation with these contacts, so that it covers substantially the exposed area of the base region. The lateral boundaries of the emitter, base, and collector regions will, of course, underlie the gaps between their respective contacts.

A more complete understanding of the present invention and its objects may be obtained from the following description taken in conjunction with the accompanying drawings, which are drawn to a greatly enlarged scale, and in which.

Figure 1:
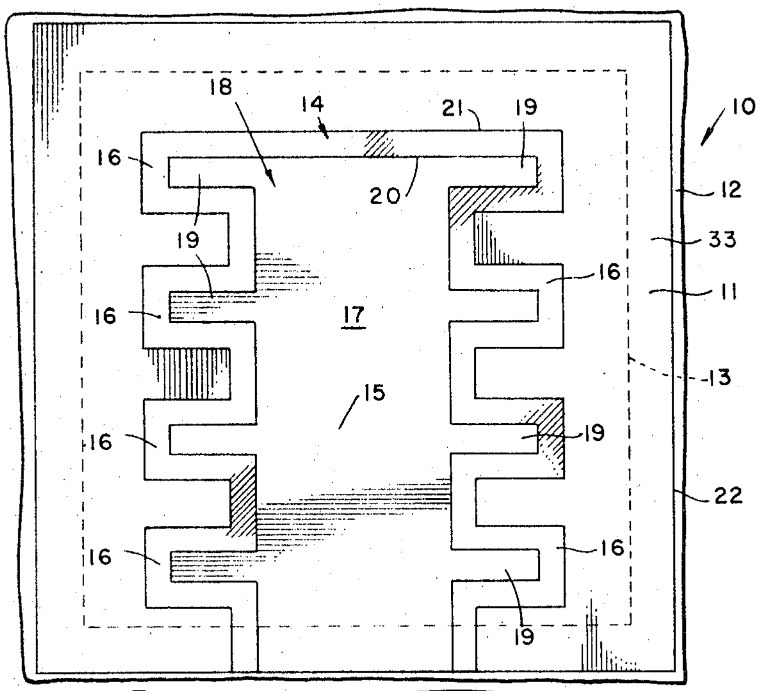
FIGURE 1 is a top view of a transistor according to the invention but before any of the contacts have been placed thereon.

Referring more particularly to the drawings, FIGURE 1 shows a top view of a portion of a semiconductor wafer or chip 10, having a doped epitaxial collector layer which forms a collector region 11 surrounded by an isolation region 12. For convenience in the description, the chip 10 will be taken as a crystalline silicon material and the transistor will be of the NPN type. Thus the collector region 11 is an N− doped layer. In order to decrease the resistance of the collector region, it is also advantageous in such transistors to provide a subepitaxial N+ buried layer 13 to improve the collector conductivity.

A base region 14 is next diffused into the collector region 11. This base region consists of a central portion 15 provided with a series of fingers 16 extending therefrom. An emitter region 17 of similar shape is then diffused into the base region 14. That is, the emitter region has a central portion 18 and a series of fingers 19 extending laterally therefrom within the boundaries of the base fingers 16. The resulting boundary between the emitter and base regions is indicated by the numeral 20, the boundary between base and collector regions by 21, and that between collector and isolation regions by 22.

Figure 2:
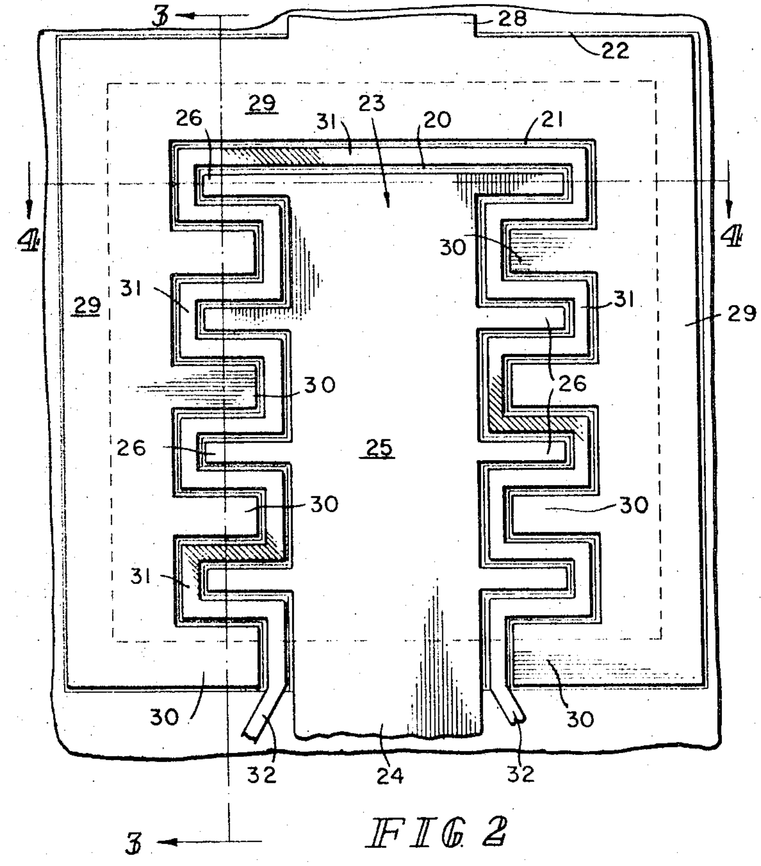
FIGURE 2 is a top view of the completed transistor of FIGURE 1.

FIGURE 2 illustrates the metallization pattern which is applied to the surface of the chip 10 after the various regions have been formed therein; as will be noted, the metallization covers substantially the total exposed area of each region. The metallized emitter contact 23 proceeds from a lead-in 24 to a central portion 25 and thence to a series of lateral extensions or fingers 26. Similarly, the collector contact 27 has a lead-in 28, a pad 29 and series of fingers 30 which are complementary to the fingers 26. The base contact 31 then assumes a serpentine shape and has leads 32. It will be noted that the base contact 31 is in closely and uniformly spaced relations to the contacts 23 and 27; typical spacing between the contacts may typically be on the order to 10 microns.

In accordance with conventional integrated-circuit practice, an N+ doped layer (P+ if this were a PNP transistor) 33 is diffused into the top surface of the exposed portion of the collector region 11 in order to improve the conductivity characteristics of the collector region.

Since the present transistor achieves a high power capability partly as a result of its operation in the switching, or class D, mode, it is important that its structure and parameters be designed specifically for this type of service. Principally, this requires that the transistor have a high current-handling capability, a low value of saturation resistance, and at least a moderately low switching time. Prior-art discrete power transistors have shown the efficacy of increasing the emitter perimeter as a means of achieving both higher power and better high-frequency characteristics, primarily by relieving base-current crowding. Several of these devices have used a topographical structure having interdigitated base and emitter contacts. The present invention, however, goes beyond this in providing interdigitated emitter and collector contacts to achieve analogous results. A short, and therefore low resistance, lateral path exists between the interlocked collector fingers 30 and emitter fingers 26. The central portion 25 of the emitter contact 23, which has a longer path to the collector contact 27, has a correspondingly larger area; this large area also prevents the buildup of hot spots and consequent thermal runaway caused by a concentration of large current in a small contact area. Similarly, the pad 29 of the collector contact 27 has a relatively large area in order to present a low resistance to the collector current flowing therein. The base contact 31, however, does not carry large currents and may thus be relatively long and narrow in comparison with the emitter and collector contacts. The large areas 25 and 29 also act to minimize debiasing which would otherwise be caused by voltage drops along the length of the emitter contact 23 and would thereby degrade the performance of the transistor.

The saturation resistance of the transistor is further lowered by maintaining the exposed portion of the base region 14 (which is substantially covered by the base contact 31) of narrow and constant width. A reduction in width between the emitter and collector contacts will decrease the resistance directly by providing a shorter path for current flowing between emitter and collector; uniformity of this width is necessary to avoid local spots of lowered resistance which might result in localized breakdown and destruction of the transistor. Reduction of the width of the base region between the emitter and collector contacts also leads to an increase in the size or number of fingers 26 and 30 which can be accommodated within a given chip area, which will also improve the characteristics of the present transistor. A transistor substantially as shown in FIGURE 2, having a total area of 0.8 square millimeter and a gap spacing between contacts of 10 microns, has a saturation resistance of 1.2 ohms at an operating current of 1 ampere, and exhibits useful gain at collector currents up to 5 amperes.

Figure 3:
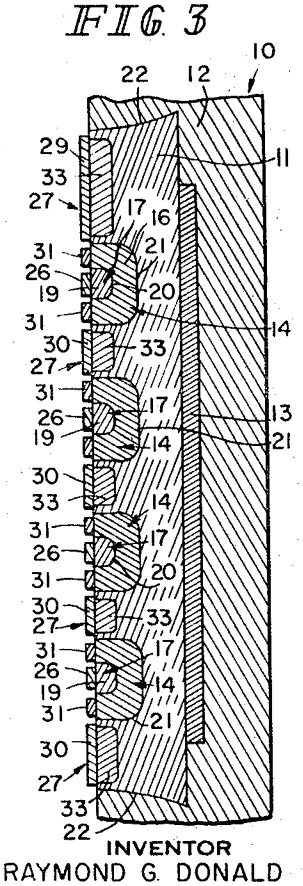
FIGURE 3 is a side view in exaggerated cross section of the transistor taken through the line 3—3 of FIGURE 2.
Figure 4:
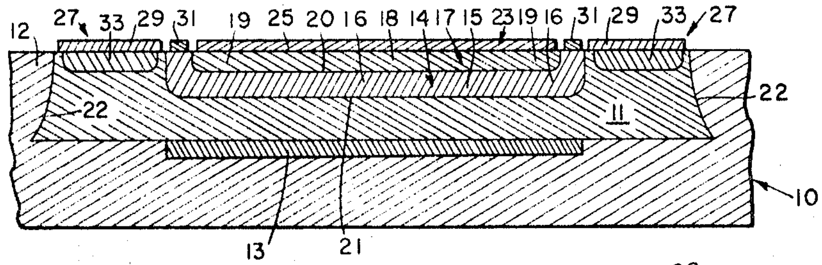
FIGURE 4 is a side view in exaggerated cross section of the transistor taken through the line 4—4 of FIGURE 2.
Figure 5:
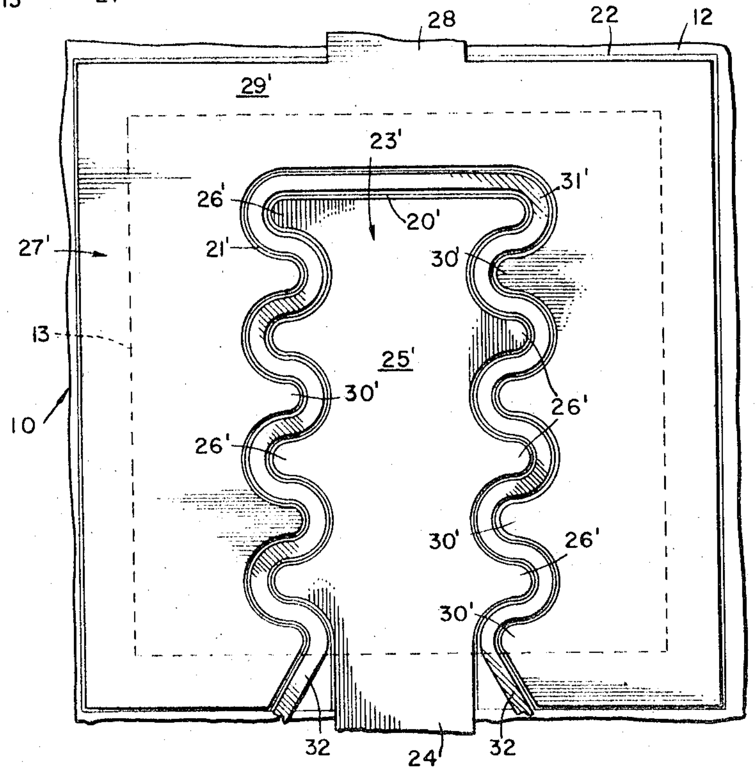
FIGURE 5 shows a top view of a variant of the transistor of FIGURE 2.

FIGURE 5 shows an interdigitated structure according to the present invention, in which the base contact 31′, and thus the exposed portion of the base region 14′, consists of two series of substantially semicircular arcs. The collector contact 27′ and emitter contact 23′ still being in closely and uniformly spaced relationship therewith, the fingers 26′ and 30′ then have substantially semicircular ends and open out more gradually to the contact portions 25′ and 29′. This configuration avoids the sharp corners and sharp changes in current-flow direction found in the geometry of FIGURE 2, although it reduces the emitter perimeter somewhat. In its internal structure, the transistor of FIGURE 5 is similar to that shown in FIGURES 3 and 4.

Figure 6:
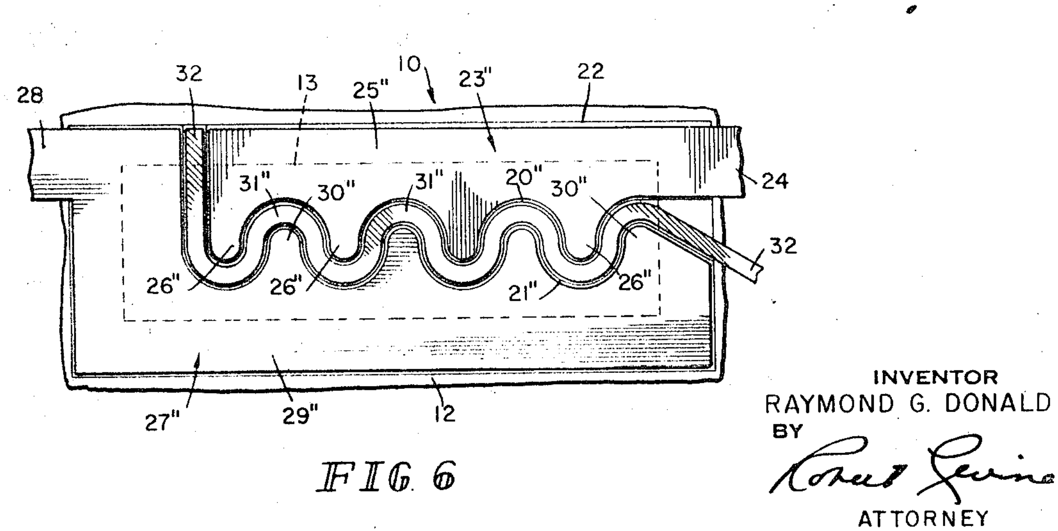
FIGURE 6 illustrates a top view of a further variation of the transistor of FIGURE 2.

The transistor illustrated in FIGURE 6 is essentially one-half of the FIGURE 5 transistor. The contacts 23″ and 27″ are interlocking comb-shaped areas, separated by the interwound base contact 31″. Although the semicircular-arc geometry is shown here, the fingers 26″ and 30″ may also be rectangular as in FIGURE 2 or some other shape as well.

It will be noted that the apparently somewhat complex shapes of the transistors described does not lead to an increased difficulty of manufacture, since extremely accurate mask drafting and alignment are necessary for the fabrication of all types of integrated circuits. In fact, the regularity and connectivity of the emitter, base and collector contacts is an advantage over other types of large-area integrated-circuit transistors, thus actually decreasing the cost of production and increasing the yield. The most important advantage of the present configuration, however, is that it provides a unitary high-current integrated-circuit power transistor which makes very efficient use of the chip area it occupies.

I claim as my invention:

1. A high-current integrated-circuit power transistor in a semiconductor chip, comprising an epitaxial collector region of a first conductivity type; a base region of a second conductivity type diffused into said collector region, said base region having a central portion of substantially linear extent and a plurality of fingers extending therefrom in at least one direction; an emitter region of said first conductivity type diffused into said base region, said emitter region having substantially the shape of said base region; said regions of first conductivity type and said regions of second conductivity type forming p-n junctions, a metallized emitter contact substantially covering said emitter region; a metallized collector contact covering substantially an exposed area of said collector region; and a metallized, serpentine base contact interwound between said collector and emitter contacts in closely and uniformly spaced relation therewith.

2. A high-current integrated-circuit power transistor in a semiconductor chip, comprising a collector region of a first conductivity type; a base region of a second conductivity type diffused into said collector region and having a central portion of substantially linear extent and a plurality of fingers extending therefrom in at least one direction; an emitter region of said first conductivity type diffused into said base region, said emitter region having a central portion of substantially linear extent and a plurality of fingers extending therefrom in at least one direction; said regions of first conductivity type and said region of second conductivity type forming p-n junctions, an emitter contact in ohmic contact with said emitter region; a collector contact in ohmic contact with said collector region; and a base contact in ohmic contact with said base region and interwound between said emitter contact and said collector contact.

3. A high-current integrated-circuit power transistor in a semiconductor chip, comprising a semiconducting substrate; an epitaxial collector region of a first conductivity type; a high conductivity subepitaxial region of said first conductivity type, whereby the resistance of said collector region is decreased; a base region of a second conductivity type diffused into said epitaxial layer, said base region having a central portion of substantially linear extent and a plurality of fingers extending therefrom in at least one direction; an emitter region of said first conductivity type diffused into said base region, said emitter region having a substantially linear central portion and a plurality of fingers extending therefrom in at least one direction; said regions of first conductivity type and said region of second conductivity type forming p-n junctions, a metallized collector contact for said collector region; a metallized contact for said emitter region; and a metallized, serpentine base contact interwound between said emitter and said collector contacts.

4. A high-current integrated-circuit power transistor in a semiconductor chip, comprising an epitaxial collector region of a first conductivity type; a base region of a second conductivity type having a substantially linear central portion and a plurality of fingers extending therefrom; an emitter region of said first conductivity type substantially covering said base region; said regions of first conductivity type and said region of second conductivity type forming p-n junctions, an emitter contact having a plurality of fingers and substantially covering said emitter region; a serpentine base contact wound around said emitter contact fingers; and a collector contact having a plurality of fingers, said collector contact fingers being interdigitated with said emitter contact fingers.

5. A high-current integrated-circuit power transistor in a semiconductor chip, comprising a collector region of a first conductivity type; a base region of a second conductivity type having a central portion of substantially linear extent and a plurality of fingers extending therefrom; an emitter region of said first conductivity type substantially covering said base region; said regions of first conductivity type and said regions of second conductivity type forming p-n junctions, an emitter contact having a central portion and a plurality of fingers extending therefrom; a collector contact having a plurality of fingers interdigitated with said emitter fingers; and a serpentine base contact in closely and uniformly spaced relation with said emitter contact fingers and with said collector contact fingers and positioned therebetween.

6. A high-current integrated-circuit power transistor in a semiconductor chip, comprising a collector region having a first conductivity type, a base region of a second conductivity type diffused into said collector region, said base region having a central region of substantially linear extent and a plurality of fingers projecting therefrom; an emitter region of said first conductivity type diffused into said base region, said emitter region having a central portion of substantially linear extent and a plurality of fingers projecting from said central portion; a highly-doped region of said first conductivity type diffused into said collector region; said region of first conductivity type and said region of second conductivity types forming p-n junctions, an ohmic emitter contact having a plurality of fingers and substantially covering said emitter region; a serpentine base contact wound around said emitter fingers; and a collector contact, around said base contact, having a plurality of fingers interdigitated with said emitter contact fingers.

7. A high-current integrated-circuit power transistor in a semiconductor chip, comprising an epitaxial collector region having a selected conductivity type, a base region of another conductivity type having a substantially linear central portion and a plurality of fingers extending therefrom, said base region diffused into said collector region; an emitter region of said selected conductivity type having substantially the shape of said base region and diffused thereinto; a highly-doped region of said preselected conductivity type within a portion of said collector region and having a plurality of fingers interdigitated with said base region fingers; said regions of differing conductivity types forming p-n junctions, a metallized collector contact overlying said highly-doped region and in ohmic contact therewith; a metallized emitter contact overlying said emitter region and in ohmic contact therewith; and a metallized base contact interwound between said emitter contact and said collector contact, said base contact being in ohmic contact with said base region.

8. A high-current integrated-circuit power transistor in a semiconductor chip, comprising a semiconducting substrate having a preselected conductivity type; an epitaxial collector region of an opposite conductivity type within said substrate; an isolation region diffused into said epitaxial region; a base region of another conductivity type diffused into said epitaxial region and having a substantially linear central portion and a plurality of fingers extending therefrom; a highly-doped emitter region of said preselected conductivity type diffused into said base region and having a substantially linear central portion and a plurality of fingers extending therefrom; said regions of differing conductivity types forming p-n junctions, a metallized emitter contact overlying said emitter and having a plurality of fingers; a metallized collector contact having a plurality of fingers interdigitated with said emitter contact fingers; and a metallized base contact interwound between said emitter and collector contact fingers and in closely and uniformly spaced relationship therewith.

9. A high-current integrated-circuit power transistor in a semiconductor chip, comprising a collector region of a first conductivity type; a base region of a second conductivity type diffused into said collector region and having a central portion of substantially linear extent and a plurality of substantially rectangular fingers projecting therefrom; an emitter region of said first conductivity type, diffused into said base region and having substantially the same shape as said base region; said regions of first conductivity type and said region of second conductivity types forming p-n junctions, an emitter contact overlying said emitter region and having a plurality of substantially rectangular fingers; a collector contact having a plurality of substantially rectangular fingers interdigitated with said emitter contact fingers; and a base contact interwound between said emitter and collector contact fingers and in closely and uniformly spaced relationship therewith.

10. A high-current integrated-circuit power transistor in a semiconductor chip, comprising a collector region of a first conductivity type; a base region of a second conductivity type diffused into said collector region and having a central portion of substantially linear extent and a plurality of fingers having substantially semicircular ends; an emitter region of said first conductivity type diffused into said base region and having substantially the same shape as said base region; said regions of first conductivity type and said region of second conductivity type forming p-n junctions, a metallized emitter contact having a substantially linear central portion and a plurality of fingers having substantially semicircular ends; a metallized collector contact having a plurality of fingers having substantially semicircular ends, said collector contact fingers being interdigitated with said emitter contact fingers; and a metallized, serpentine base electrode interwound between said collector contact fingers and said emitter contact fingers.

References Cited

UNITED STATES PATENTS

| | | | |
|---|---|---|---|
| 2,924,760 | 2/1960 | Herlet | 317—235 |
| 3,124,640 | 3/1964 | Armstrong | 174—72 |
| 3,166,448 | 1/1965 | Hubner | 148—177 |
| 3,210,563 | 10/1965 | New | 307—88.5 |
| 3,214,652 | 10/1965 | Knowles | 317—235 |
| 3,309,585 | 3/1967 | Forrest | 317—234 |
| 3,358,197 | 12/1967 | Scarlett | 317—235 |
| 3,368,123 | 2/1968 | Rittmann | 317—235 |

JOHN W. HUCKERT, Primary Examiner

JERRY D. CRAIG, Assistant Examiner

U.S. Cl. X.R.

29—591